United States Patent [19]

Goff, Jr.

[11] Patent Number: 4,587,727
[45] Date of Patent: May 13, 1986

[54] SYSTEM FOR GENERATING CIRCUIT BOARDS USING ELECTROERODED SHEET LAYERS

[75] Inventor: Willie Goff, Jr., Austin, Tex.

[73] Assignee: International Business Machines Corporation, Armonk, N.Y.

[21] Appl. No.: 510,540

[22] Filed: Jul. 5, 1983

[51] Int. Cl.$^4$ .............................................. H05K 3/36
[52] U.S. Cl. ........................................ 29/830; 29/593; 174/68.5; 324/73 PC; 361/414
[58] Field of Search ................. 29/830, 847, 842, 593; 174/68.5; 361/414, 401, 412, 413; 339/17 C; 324/73 PC

[56] References Cited

U.S. PATENT DOCUMENTS

| | | | |
|---|---|---|---|
| 3,470,612 | 10/1969 | Helms | 29/593 |
| 3,484,935 | 12/1969 | Burns | 29/842 |
| 3,583,066 | 6/1971 | Carbonel | 174/68.5 X |
| 4,056,773 | 11/1977 | Sullivan | 324/73 PC |
| 4,449,769 | 5/1984 | Kobayashi et al. | 361/414 X |

OTHER PUBLICATIONS

"Forum on IC Packaging Panels", by Alex Mendelsohn, *Electronic Products* Magazine, Feb. 1979, pp. 27-36.
"Manufacture of Circuit Boards Utilizing Electroerosion and an Automatic Drafting Table", *IBM Technical Disclosure Bulletin*, vol. 19, No. 2, Jul. 1976, pp. 575-576.
IBM Tech. Discl. Bull., vol. 8, No. 8, Jan. 1966, p. 1056, by Baffaro.
IBM Tech. Discl. Bull., vol. 8, No. 3, Aug. 1965, p. 434, by Kremen.
IBM Tech. Discl. Bull., vol. 11, No. 8, Jan. 1969, p. 962, by Hermann.
IBM Tech. Discl. Bull., vol. 14, No. 10, Mar. 1972, p. 2869, by Fugardi et al.

*Primary Examiner*—Howard N. Goldberg
*Assistant Examiner*—Carl J. Arbes
*Attorney, Agent, or Firm*—Marilyn D. Smith

[57] ABSTRACT

By use of an electroerosion technique a plurality of conductive lines (5) are isolated out of an electrically conductive sheet material supported on an isolating substrate of a sheet having holes in a distinct pattern. Several sheets are superimposed in different planes and are alternately mixed with interplane spacer-connector layers between a terminal block (32) and a pressing guide block. The interplane spacer-connector layer (24) contains contact areas interconnected with each other and make contact with isolated zones in different superimposed planes of sheets. The terminal block is provided with sockets for holding the terminals of circuit components of the to-be-developed electrical circuit.

8 Claims, 4 Drawing Figures

SYSTEM FOR GENERATING CIRCUIT BOARDS USING ELECTROERODED SHEET LAYERS

TECHNICAL FIELD

The present invention relates to a system for generating circuit boards using an electroerosion technique for burning out areas adjacent to lines to be produced by controlled activation of electrodes of an electroerosion head.

BACKGROUND ART

In the developing of todays circuits to be packaged on a circuit board which might be printed circuit board having one, two, or multiple layers, combersome procedures are involved. Those cumbersome procedures include the establishing of a wiring list with the support of a computer, printing this list telling which connector pin has to be connected by a line or wire respectively with which pin, and laboriously providing those connections physically, by for instance through use of a wire-wrapping technique. There is a considerable time delay between having the printout with the wiring list for a board and producing the completed board. Changes in the interconnection pattern call for a complete new manufacturing cycle with a new wiring list and new, or at least additional, wiring, and, hence, considerable delays usually cannot be avoided.

An electroerosion technique together with an automatic drafting table for the manufacturing of circuit boards is disclosed in *IBM Technical Disclosure Bulletin*, Vol. 15, No. 2, July 1976, pages 575 and 576. Instead of an ink pen head the automatic drafint table is equipped with an electroerosion head. Electrodes of this head are powered to erode areas around the lines to be generated. The electrodes of the electroerosion head evaporate the copper from the circuit board as the drive system of the drafting table moves the head. The width of the line depends on the numbers of adjacent nonpowered electrodes. The thickness of lines can be increased by adding material to the finished copper ine pattern. This described arrangement shortens the cycle required to obtain the artwork for circuit boards but does not povide a way of shorten the design cycle of circuit development.

DISCLOSURE OF INVENTION

The main object of the present invention is to provide a concept, a system and its components to shorten the design cycle of circuit developmen. Furthermore, this invention facilitates the manufacture of prototype circuit interconnections thus replacing the breadboard and making wire-wrapped experimental boards obsolete.

These and other objects are accomplished in accordance with the invention basically by use of an electroerosion technique which is used to generate a plurality of isolated conductive zones on a number of aluminized nonconductive substrate layers. Each of the zones includes at least two holes. Prior to the erosion step all of the holes in the layer which are usually in a grid configuration were electrically connected. After the erosion step only selected ones of the holes are electrically connected. The thus formed layers are stacked with an electrically conductive spacer between each pair of layers. The spacer has conductive pins arranged in a grid pattern identical to the grid pattern of each layer such that electrical continuity through a stack of layers is obtained through each hole. Thus through selective formation of the conductive zones on the layers, theoretically, any hole or holes of the grid pattern on the two outermost layers can be interconnected. The substrate layers and interconnection means are then pressed together onto a terminal block. The circuit components may then be mounted.

This allows changing of the connections to be made easily by electroeroding newly designed layers and exchanging them for obsolete layers. This can be done in a rather short time so that this short turnaround time shortens the prototype cycle in circuit development considerably. The invention provides a tool which replaces the usual breadboard approach with a circuit board arrangement that is extremely versatile in allowing alterations and improvements.

In the preferred embodiment of the invention, the nonconductive substrate is covered with a combined aluminum/graphite layer which closely simulates the conductivity of a copper layer usually used in a printed circuit board.

The substrate contains holes spaced in a grid pattern such that they will accommodate standard circuit components.

BRIEF DESCRIPTION OF DRAWINGS

In the following, the invention will be described in detail in connection with the accompanying drawing showing an embodiment of the invention, in which.

BEST MODE FOR CARRYING OUT THE INVENTION

Figure 1:
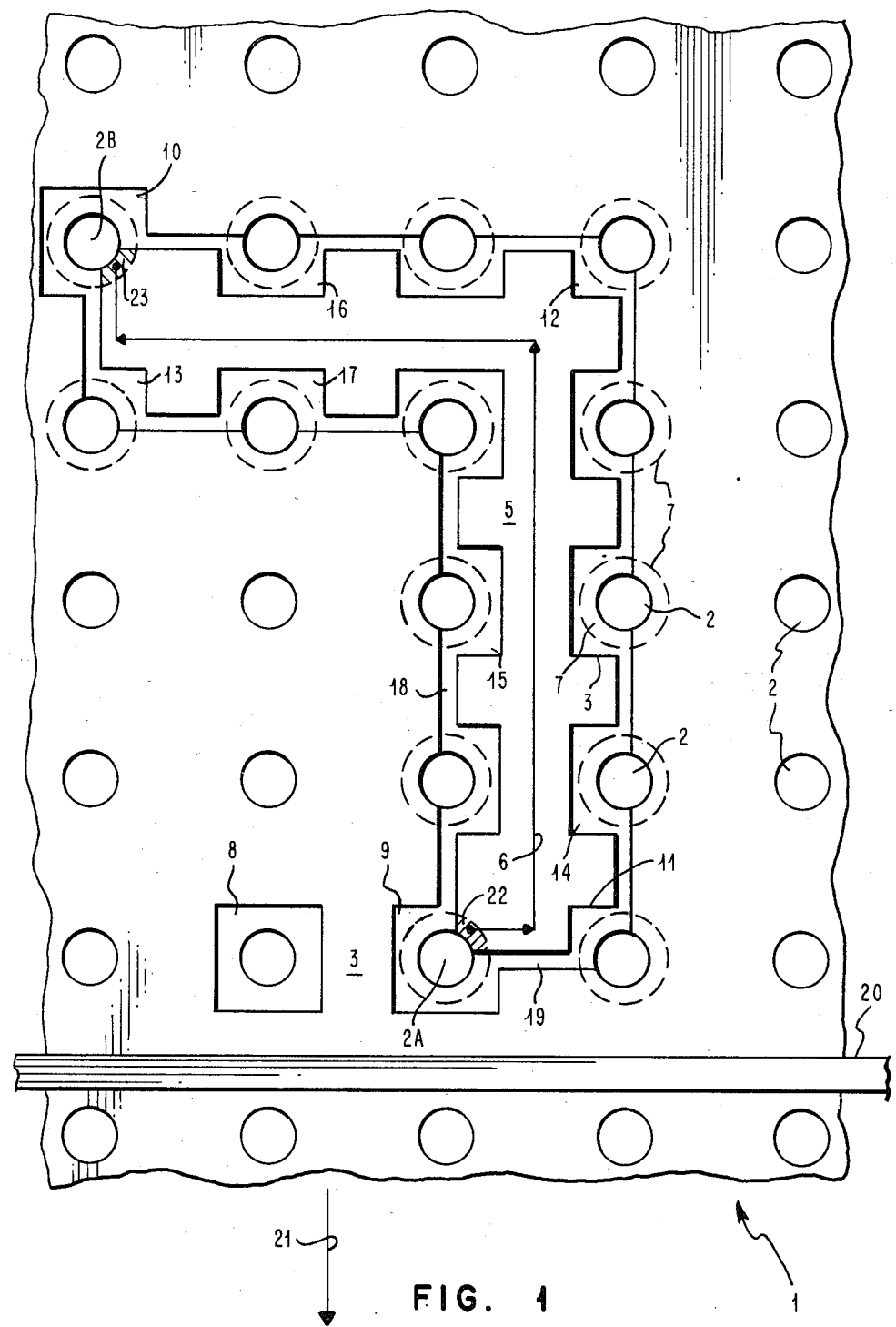
FIG. 1 is a top view of a section of a sheet used and prepared in accordance with the invention, showing the holes arranged in a sheet in a distinct grid pattern and showing parts of the electrically conductive layer removed to form an isolated zone forming a conductor between two holes.

In the top view of FIG. 1 a section of a sheet 1 is shown. Sheet 1, a composite structure, is perforated with a series of holes 2 that are arranged in a distinct pattern. In the shown pattern the holes 2 are arranged in squares having an edge length of about 2.54 mm (0.1 inch). The diameter of a hole 2 is about 0.762 mm (0.03 inch). The holes 2 are all over the sheet 1 in a rectangular grid of rows and columns.

Sheet 1 is a composite structure comprising at least an erodible electrically conductive top layer entirely covering a second nonconductive carrier layer. After selective electroerosion the electrically conductive layer 3 only connects selected holes as will later be described in more detail. The electrically conductive layer 3 is preferably made from a combination of aluminum and graphite and might be applied with a binder material. The combined aluminum/graphite layer 3 should approximately simulate the conductivity of a copper layer used widely in printed circuit boards. The structure of the sheet material could be for instance as shown and described in U.S. Ser. No. 454,744, filed on Dec. 30, 1982, of M. S. Kohen, or U.S. Ser. No. 454,743, filed on Dec. 30, 1982, of M. S. Kohen et al. It should be noted that the material need not include ink material as is the usual case where the end product is for human viewing. Instead, in the present invention the electrical conductivity of the material is the decisive property.

Following is a description of the formation of a conductive path between holes 2A and 2B of FIG. 1. This path is shown by reference number 5 and for purposes of clarity is indicated by arrow 6. To isolate conductive path 5 from surrounding electrically conductive layer 3, conductive material is eroded on both sides of it and around the necessary holes 2 which contact with other superimposed sheets 1 upon stacking.

In FIG. 1 the area which has been eroded away and therefore is non conductive is shown outlined in solid lines defining a generally upside down L-shaped area. The outer diameter of the electrical contact areas is indicated by dotted circles 7. These contact areas will be described having reference to FIGS. 2 and 3. At 8 an area is shown which is completely eroded in a square form around a hole 2. This provides complete electrical isolation of the hole from the remainder of the conductive layer 3. At 9 three-fourths of a square is shown eroded around hole 2A with the upper right corner left in the conductive path. At 10 another three-fourths of a square is shown eroded around hole 2B but with the lower right corner left in the conductive path. At 11 is shown the upper left one-fourth of the square eroded away to electrically isolate the hole from the conductor 5. At 12 the lower left corner is eroded, and at 13 the upper right corner of the square is eroded. Half squares eroded in their left and right half are indicated with reference numbers 14 and 15, respectively, those eroded in their lower and upper half are indicated with reference numbers 16 and 17, respectively. All together, four differently oriented $\frac{1}{4}$, $\frac{1}{2}$, and $\frac{3}{4}$ portions as well as one full square, form the configurations of all possible eroded areas around holes 2. Examination of FIG. 1 will show that selective erosion in the manner above described is used to isolate the remainder of the holes from the conductor 5 which connects holes 2A and 2B.

The shape of a square or parts of a square is chosen as it is the simplest one for use with electroerosion. It should be noted that other shapes can be used. Returning again to FIG. 1, there are vertical and horizontal areas eroded in the shape of small stripes, indicated by reference numbers 18 and 19, respectively. These stripes 18 and 19 separate the electrically conductive path or conductor 5 from the remainder of layer 3 in the non hole areas of the conductors. Thus, stripes 18 and 19 which are eroded connect the eroded areas around holes which are not to be in the conductive path to provide electrical conductor 5.

Eroding or burning out the differently shaped and oriented areas 8, 9, 10, 11, 12, 13, 14, 15, 16, 17, 18 and 19 is donw as previously stated by an electroerosion technique. For that sheet 1 is fed through electroerosion head 20 in direction of arrow 21. Preferably, head 20 spans over the entire width of sheet 1 so that no registration problems are evisaged. By this technique all the areas to be eroded over the entire width of the sheet 1 are burned off by powering the appropriate electrodes, which are not shown in detail, of head 20 for an appropriate length of time and in an appropriate configuration along the axis of head 20 across sheet 1. A page-wide electroerosion head which could be used for that purpose is disclosed in U.S. Ser. No. 213,516, assigned to the same assignee as the present invention and filed on Dec. 5, 1980, of W. Goff, Jr. et al, now U.S. Pat. No. 4,397,085 issued Aug. 9, 1983 herewith included by reference. Selective energization of the electrodes is well known and forms no part of the present invention.

When line 5 is isolated by burning off the above-mentioned areas, two contact areas 22 associated with hole 2A and 23 associated with hole 2B are left. These contact areas, as later described in detail, may be in electrical contact through those holes 2A and 2B with other sheets 1 that are superimposed in different planes.

Figure 2:
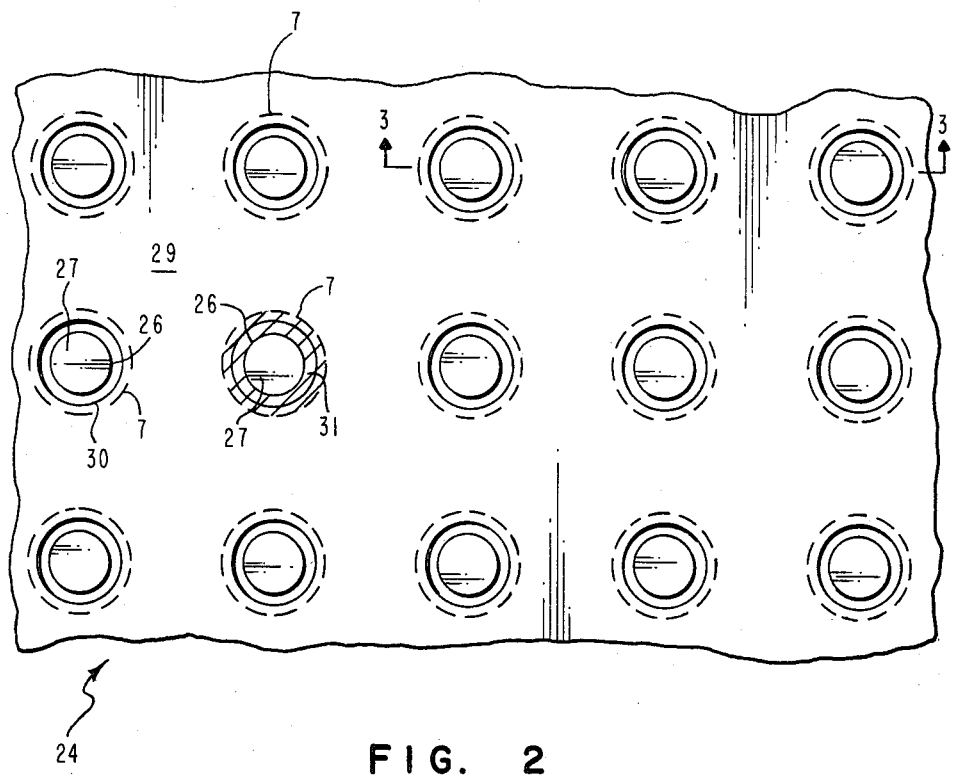
FIG. 2 is a top view of a section of an interplane spacer-connector layer showing the connectors arranged in the distinct grid pattern similar to that of FIG. 1 and having resilient elastomer areas between them.
Figure 3:
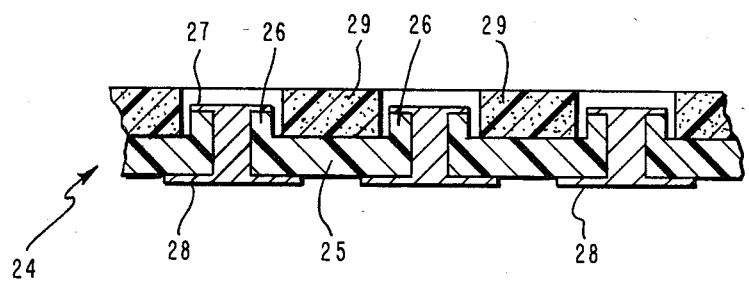
FIG. 3 is a sectional view taken along line 3—3 of FIG. 2 showing in cross section the differently sized contact areas of the connectors, the carrying body of the interplane spacer-connector layer and the elastomers attached to it.

For providing contact to superimposed sheets an interplane spacer-connector layer 24 is provided. It is shown in FIG. 2 in a top view and in FIG. 3 in a sectional view along line 3—3 of FIG. 2. The layer 24 compises a main body core part 25 which is preferably a molded structure made from plastic material of appropriate stiffness and flexibility. On one side of the core part 25 studs 26 are provided in the same distinct pattern as the holes 2 in sheet 1. The diameter of these round studs 26 is chosen such that they fit into the holes 2 and are able to penetrate sheet 1 which requires that they be slightly smaller in diameter. The outer surface of studs 26 which is parallel to the main plane of layer 24 is covered with an electrically well-conducting material, e.g., copper and/or gold, for forming a small contact area 27. On the other side of layer 24 immediately opposite those small contact areas 27 of studs 26 larger contact areas 28 are provided. These contact areas 28 are therefore also arranged in the distinct pattern of holes 2 of sheet 1. These areas 28 are also made from a thin layer of copper and/or gold. To provide the interplane electric connection those contact areas 27 and 28 are electrically connected. This might be done by making the studs 26 hollow and covering the inner wall with copper and/or gold or by filling such a hollow stud completely with an electrically conductive material such as copper and connecting that to both electrically conductive layers of areas 27 and 28.

On one side of the core part 25 of the interplane spacer-connector layer 24 and between the studs 26, elastomers 29 are provided. These elastomers 29 protrude in their uncompressed state beyond the plane of contact areas 27 of studs 26 and terminate on line 30 around studs 26. When compressed in superimposed lamination with sheets 1 and other interplane spacer-connector layers 24, as well as other means, those elastomers 29 give the necessary stiffness to sheet 1 and the necessary contact force between the contact areas 3 of sheet 1 and 28. As illustrated by the shaded ring 31 shown in FIG. 2, situated between the outer circumference of stud 26 and circle 7 and in superimposed position, the larger contact area 28 can make contact with the electrically conductive layer 3 of sheet 1. In the center of this ring 31 the smaller contact area 27 of one interplane spacer-connector layer 24 can make contact with the larger area 28 of the other interplane spacer-connector layer 24 between which the sheet 1 is positioned (FIG. 4).

Figure 4:
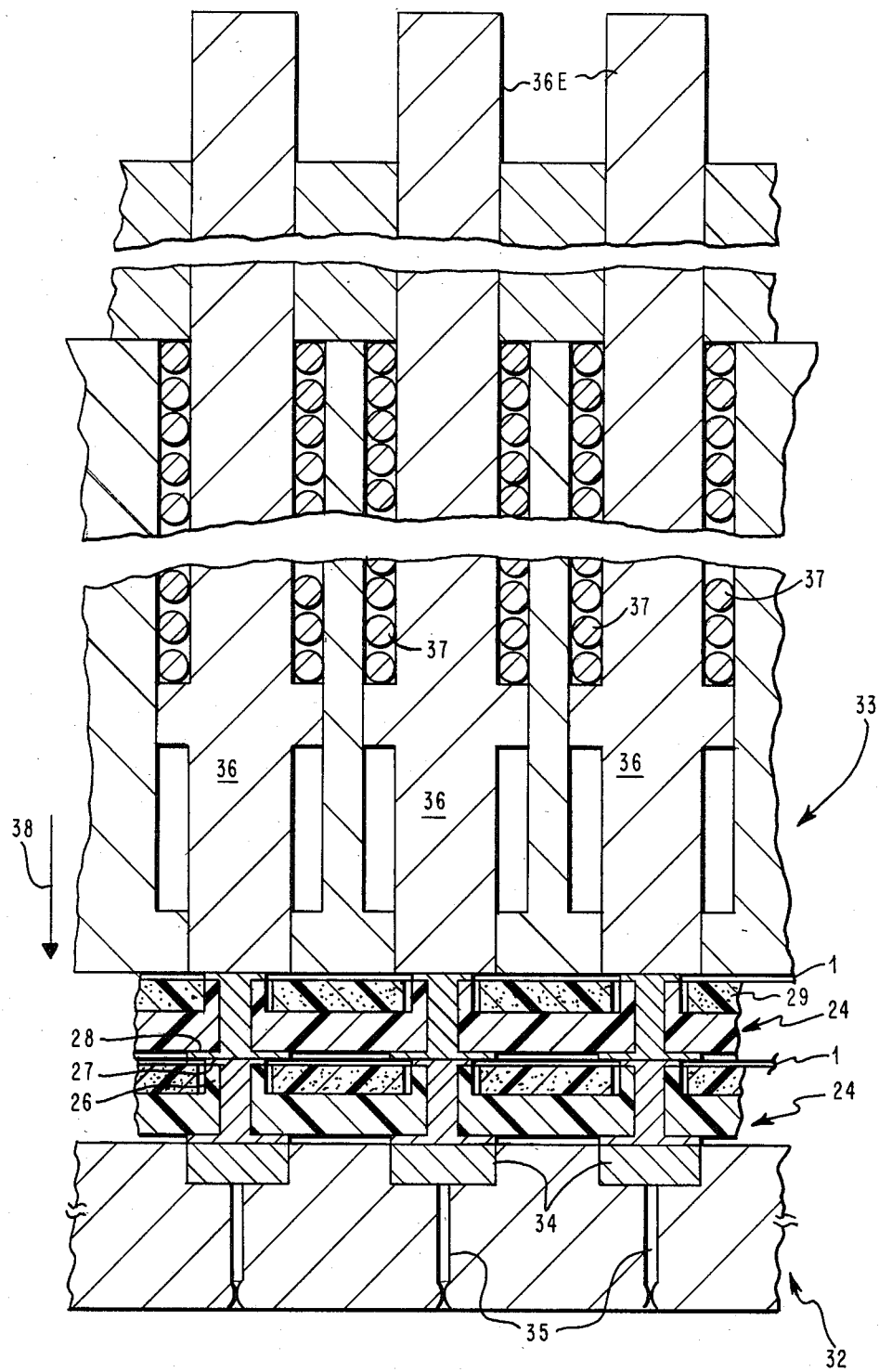
FIG. 4 is a cross sectional view showing a lamination of two sheets carrying isolated zones of electrically conductive layer intermixed with two interplane spacer-connector layers, the lamination being kept between a terminal block having contact pads and sockets and a pressure block having individually biased pins.

FIG. 4 shows in a sectional side view two sheets 1 interposed with two intermediate interplane spacer-connector layers 24 on top of a terminal block 32 and underneath a pressure exerting guide block 33. Terminal block 32 and guide block 33 are kept in this position by means not shown. The terminal block 32 comprises contact pads 34 which are arranged in the same distinct pattern as the holes 2 in sheet 1. The terminal block 32 may furthermore contain sockets 35. Those sockets 35 are arranged in a distinct pattern and each socket 35 is connected to one contact pad 34. In the sockets 35 terminals of circuit components not shown can be inserted and held in place. The shown guide block 33 contains piston like pins 36 arranged in the distinct pattern of the holes 2 in sheet 1. Each pin 36 is shiftable within block 33 and individually biased by springs 37 which tend to press the pins 36 out of block 33 in direction of arrow 38. Pins 36 may be made out of electrically conductive material and extend out of guide block 33 on top of it. Thus, those extremities 36E may be used as additional wiring means.

The build up of a tool circuit board in accordance with the invention is explained in connection with FIG. 4. On top of terminal block 32 a first interplane spacer-connector layer 24 is placed with the larger contact area 28 resting on the equally dimensioned contact pad 34 of terminal block 32. On top of this first interplane spacer-connector layer 24 is placed a first sheet 1 with its nonconductive substrate 4 facing the underlying spacer-connector layer 24. Studs 26 with their small contact areas 27 penetrate the holes 2 of sheet 1. Next, a second interplane spacer-connector layer 24 is placed on top of the first sheet 1 in the same manner of orientation as the first one onto terminal block 32. The larger contact area 28 of the second interplane spacer-connector layer 24 and the small contact area 27 of the first interplane spacer-connector layer 24 are in contact. Between these two layers is the first sheet 1 with its conductive and eroded areas. On top of the second interplane spacer-connector layer 24 a second sheet 1 is arranged, again with the nonconductive substrate 4 facing the underlying interplane spacer-connector layer 24. The studs 26 of this second interplane spacer-connector layer 24 are again able to penetrate the holes 2 of the second sheet 1.

For setting up the contact through the different planes, i.e., vertical to the main plane orientation, the guide block 33 and the terminal block 32 are positioned such that the pins 36 under the biasing forces of springs 37 press together all elastomers 29 into the positions shown in FIG. 4. Thus the larger contact areas 28 of the lower interplane spacer 24 are contacting the contact pads 34, the smaller and larger contact areas 27 of spacer 24 and larger pads 28 are contacting each other, the larger contact areas 28 of the upper spacer are, where appropriate, contacting not eroded areas of the electrically conductive material 3 of sheet 1, and pins 36 of guide block 33 are contacting smaller contact areas 27 of the top interplane spacer-connector layer 24 as well as electrically conductive material 3 of sheet 1 where appropriate. Sheet 1 clamped either between smaller 27 and larger 28 contact areas or between smaller contact areas 27 and pins 36 having a pressure area equivalent to that of a larger contact area, is either included in or excluded from building up electrical continuity between the planes in which those sheets are positioned. This depends on the presence or absence of the electrically conductive layer 3 of sheet 1 in the clamping areas.

Once a so called wiring list for the circuit under development is designed by the developer and the appropriate values which tell which pin has to be connected with which pin, the control is easily modified to actuate the appropriate electrodes of head 20 in conjunction with the feeding of sheet 1 underneath it, for preparing different layers of the arrangement shown in FIG. 4, by eroding in each sheet layer those areas to establish the desired lines. Therefore, overall, changes in design, i.e., changes in the setting up of the connections among terminals of the circuit components, are easily performed by reprinting one sheet, several sheets, or the whole set of sheets 1 and reassembling them between terminal block 32 and guide block 33. Therefore, a shorter turnaround time between first and final circuit design is gained.

It should be noted that terminal block 32, guide block 33 and the interplane spacer-connector layers 24 have to be built up only once and are reusable. The sheets 1 representing different line configurations in accordance with the different circuit connections, vary and are to be replaced with each change. But as mentioned, those changes are easily accomplished by printing or eroding, respectively, new sheets.

The distinct pattern in which the holes 2 in sheet 1 are arranged is preferably the pattern in which the holes in usually used printed circuit boards are arranged. That means that the terminals of the usual circuit components match with this pattern. The connectors in the interplane spacer-connector layers, the pins 36 in the guide block 33, the connector pads 34 in the terminal block 32 and the sockets 35 are arranged in the same pattern.

The holes 2 in sheet 1 might have a diameter of 0.762 mm (0.03 inch) and be distanced for 2.54 mm (0.1 inch), the diameter of the stud 26 and of the smaller contact area 27 is slightly smaller and than the hole diameter. The diameter of the larger contact area 28 might be chosen to be 1.27 mm (0.05 inch), the edge length of the square-shaped, burned out area 8 is about 1.78 mm (0.07) inch and the width of the small areas 18 and 19 might be chosen to be 0.254 mm (0.01 inch).

It should be noted that, for example, the terminal block 32 might have a configuration on the side opposite the circuit components, which is the same as the side carrying the studs 26 of the interplane spacer-conncector layer 24. Thus, it would be possible to place the first sheet 1 immediately onto the terminal block 32.

While this invention has been particularly shown and described with reference to a preferred embodiment thereof, it will be understood by those skilled in the art that foregoing and other changes in form and details may be made therein without departing from the spirit and scope of the invention.

I claim:

1. A method of producing simulated printed circuit boards comprising:
    electroeroding portions of metallic layers of a plurality of sheet-like, composite structures perforated in a uniform pattern so as to electrically isolate conductive paths between selected perforations; and
    electrically connecting at least two composite structures by placing between them a generally planar member having electrical contacts arranged in an uniform pattern through a non-conductive substrate, said pattern corresponding to the pattern of perforations in the composite structures.

2. The method of claim 1 additionally including the step of clamping the electrically connected composite structures between a terminal member in which circuit components may be mounted and a guide block for testing.

3. The method of claim 1 or 2 wherein the electroeroding step is performed on composite structures with an aluminum/graphite layer.

4. A method of testing multilayer printed circuitry designs comprising:
   forming conductive paths simulating a layer of circuitry in each of a plurality of replaceable sheets having a metallic coating;
   joining the plurality of replaceable sheets, each simulated with said layer of circuitry, with reusable electrical connectors; and
   sandwiching the electrically connected simulated layers between a reusable component bearing member and a reusable conductive base block.

5. The method of claim 4 wherein the forming step additionally includes electroerosion of a pattern in the metallic coating to isolate a conductive path between selected ones of uniformly arraged perforations in the composite structure.

6. The method of claim 5 wherein the joining step includes placing a non-conductive substrate having conductive eyelets uniformly arranged there through corresponding to the perforations in the composite structure.

7. The method of claims 4, 5 or 6 wherein the forming, joining and sandwiching steps are repeated for evaluating changes to the configuration of the conductive paths.

8. The method of claims 4, 5, or 6 wherein the metallic coating is aluminum/graphite.

* * * * *